United States Patent
Ha (10) Patent No.: US 9,634,646 B1
(45) Date of Patent: Apr. 25, 2017

(54) MISMATCH CALIBRATION OF CAPACITIVE DIFFERENTIAL ISOLATOR

(71) Applicant: ANALOG DEVICES, INC., Norwood, MA (US)

(72) Inventor: Dongwan Ha, Medford, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 14/924,310

(22) Filed: Oct. 27, 2015

(51) Int. Cl.
*H03L 5/00* (2006.01)
*H03H 11/28* (2006.01)
*H03H 11/04* (2006.01)
*H03K 3/012* (2006.01)
*H03K 19/0185* (2006.01)

(52) U.S. Cl.
CPC ............. *H03H 11/28* (2013.01); *H03H 11/04* (2013.01); *H03K 3/012* (2013.01); *H03K 19/018521* (2013.01)

(58) Field of Classification Search
CPC ........... H03K 3/356; H03K 19/018521; H03K 19/00315; H03K 17/102; H03K 3/012; H03H 11/28; H03H 11/04
USPC ......... 326/306, 333, 61–62, 80–81; 327/306, 327/333
See application file for complete search history.

(56) References Cited

U.S. PATENT DOCUMENTS

| | | | |
|---|---|---|---|
| 4,906,966 A | 3/1990 | Imamura et al. | |
| 6,448,815 B1 | 9/2002 | Talbot et al. | |
| 7,003,023 B2 | 2/2006 | Krone et al. | |
| 8,571,093 B1 * | 10/2013 | Van de Beek | H04L 25/0266 375/219 |
| 8,792,836 B2 * | 7/2014 | Mikhemar | H04B 1/0458 455/78 |
| 8,878,587 B1 * | 11/2014 | Steensgaard-Madsen | G05F 3/02 327/306 |
| 8,896,377 B1 | 11/2014 | Shrestha | |
| 9,306,609 B1 * | 4/2016 | LaCroix | H04B 3/548 |
| 2008/0051158 A1 | 2/2008 | Male et al. | |
| 2008/0279288 A1 | 11/2008 | Crawley et al. | |
| 2009/0027243 A1 * | 1/2009 | Leung | H01L 23/48 341/100 |
| 2009/0074110 A1 * | 3/2009 | Vorenkamp | H04L 25/08 375/317 |

* cited by examiner

*Primary Examiner* — Dinh T Le
(74) *Attorney, Agent, or Firm* — Wolf, Greenfield & Sacks, P.C.

(57) ABSTRACT

Embodiments of the present disclosure may provide a method of calibrating an isolator system. The method may comprise the steps of driving a common signal to a pair of input terminals of the isolator system; measuring differences in signals at output terminals of the isolator system; and varying impedance of impedance elements connected between the output terminals and a center-tap terminal of the isolator system until a mismatch at the output terminals is minimized.

22 Claims, 7 Drawing Sheets

MISMATCH CALIBRATION OF CAPACITIVE DIFFERENTIAL ISOLATOR

BACKGROUND

The present invention generally relates to mismatch calibration of a capacitive differential isolator.

Demands for low power, high speed isolated communication call for innovations in the architecture of communication channels. The use of capacitors as galvanic isolation barriers may play a leading role in improving performance, reducing form factor, and reducing costs of communication channels.

Capacitors are not inherently differential devices although they find application in differentially-driven isolator systems. Thus, to isolate a transmitter from a receiver, and to transmit a differential signal from the transmitter to the receiver, a capacitive differential isolator requires at least two capacitors.

It is desirable for a capacitive differential isolator to maintain noise and interference immunity when transmitting a differential signal from the transmitter to the receiver. If there is an impedance mismatch between the differential paths of the capacitive differential isolator, the immunity performance and the signal integrity along the capacitive isolation barrier get significantly degraded. Common-mode interferences are converted to unintended differential signals due to the impedance mismatch. These unintended differential signals cannot be distinguished from the intended differential signal and thus cannot be filtered out. Consequently, both the intended and unintended differential signals get transmitted to the receiver.

Since impedance mismatches have significant negative impact on the performance of communication channels, the inventor recognized a need in the art for calibrating impedance mismatches in capacitive differential isolators.

DETAILED DESCRIPTION

Embodiments of the present disclosure may provide a method of calibrating an isolator system. The method may comprise the steps of driving a common signal to a pair of input terminals of the isolator system; measuring differences in signals at output terminals of the isolator system; and varying impedance of impedance elements connected between the output terminals and a center-tap terminal of the isolator system until a mismatch at the output terminals is minimized.

Embodiments of the present disclosure may provide an isolator system, comprising an isolator having a pair of output terminals and a filter connected across the output terminals. The filter may comprise a pair of capacitors, each connected to a respective output terminal and to each other, and pair of variable resistors, each connected to a respective output terminal and to each other at a node where the capacitors are connected together, the resistors having mismatched resistances.

Embodiments of the present disclosure may provide a calibration system, comprising a signal source to drive a common signal across a pair of input terminals of an isolator system, a mismatch detector to generate a mismatch signal based on an output signal at a pair of output terminals of the isolator system, and a controller to vary impedance of an impedance network connected between the output terminals of the isolator system until the mismatch signal is minimized.

Figure 1:
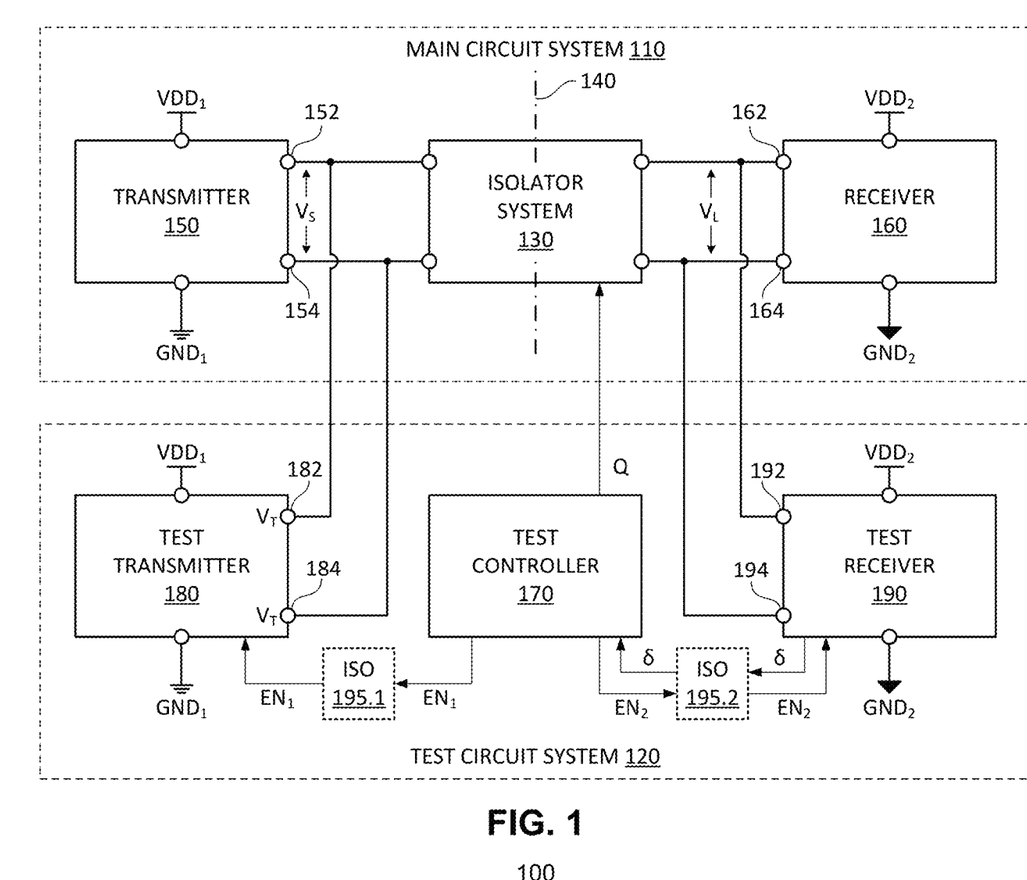
FIG. 1 illustrates a differentially isolated system according to an embodiment of the present disclosure.

FIG. 1 illustrates a differentially isolated system 100 according to an embodiment of the present disclosure. The system 100 may include a main circuit system 110 coupled to a test circuit system 120. The main circuit system 110 may include an isolator system 130 that bridges an isolation barrier 140 and provides a communication channel between a transmitter 150 in a first voltage domain and a receiver 160 in a second voltage domain. The test circuit system 120 may include a test controller 170 to control a test transmitter 180 and a test receiver 190, and to calibrate the isolator system 130 of the main circuit system 110.

In the main circuit system 110, the isolator system 130 may galvanically isolate the transmitter 150 from the receiver 160. Thus, the transmitter 150 and the receiver 160 may be grounded at different potentials (e.g., $GND_1$ and $GND_2$), preventing ground loops (i.e., preventing unwanted current flows between the two voltage domains). The transmitter 150 and the receiver 160 may also be powered from different sources (e.g., $VDD_1$ and $VDD_2$).

The transmitter 150 may transmit a differential input voltage $V_S$ via differential paths provided by the isolator system 130, resulting in a differential output voltage $V_L$ at output terminals of the isolator system 130 and input terminals of the receiver 160. As discussed, an impedance mismatch between the differential paths of the isolator system 130 may convert common-mode interferences, which may exist due to parasitic capacitances between the two voltage domains, into unintended differential signals. These unintended differential signals may get transmitted via the isolator system 130, and undesirably and unnoticeably contribute to the differential output voltage $V_L$.

The test circuit system 120 may calibrate the isolator system 130 to counteract possible impedance mismatch between the differential paths of the isolator system 130. The test transmitter 180 may have output terminals 182, 184 that are coupled to output terminals 152, 154 of the transmitter 150. Similarly, the test receiver 190 may have input terminals 192, 194 that are coupled to input terminals 162, 164 of the receiver 160. Although the test transmitter 180 is shown in FIG. 1 as a discrete circuit system that is separated from the transmitter 150, as discussed below, this need not be the case in all embodiments. Similarly, although the test receiver 190 is shown in FIG. 1 as a discrete circuit system that is separated from the receiver 160, as discussed below, this need not be the case in all embodiments.

In the test circuit system 120, the test controller 170 may control the test transmitter 180 and the test receiver 190, and generate a control signal Q to calibrate the isolator system 130. In some embodiments, the test controller 170 may be located in a separate voltage domain from the test transmitter 180 and/or the test receiver 190. In such cases, the test controller 170 may communicate with the test transmitter 180 or test receiver 190 via respective isolators 195.1, 195.2. As such, the test transmitter 180 may be coupled within the first voltage domain (i.e., to $VDD_1/GND_1$) and the test receiver 190 within the second voltage domain (i.e., to $VDD_2/GND_2$). Devices of the test controller 170 may be coupled within either the first or the second voltage domain.

The test controller 170 may enable the test transmitter 180 and the test receiver 190 (for example, with signals $EN_1$ and $EN_2$, respectively) when the transmitter 150 is disabled (i.e., $V_S=0$). When enabled, the test transmitter 180 may supply a common test voltage $V_T$ (e.g., identical single-ended voltages) to both differential paths of the isolator system 130. The test voltage $V_T$ may replicate a common-mode transient that might be experienced by the system 100 in run-time operation. Alternatively, a single, albeit relatively higher magnitude, voltage (not shown) may be applied across the two grounds (i.e., $GND_1$ and $GND_2$) of the two voltage domains to replicate common-mode interferences. If an impedance mismatch is present in the differential paths of the isolator system 130, the test voltage $V_T$ may induce a differential output voltage $V_L$ at an output of the isolator system 130.

The test receiver 190 may detect mismatch from the output voltage $V_L$ and may generate a mismatch signal $\delta$ therefrom. In response, the test controller 170 may generate a control signal Q to adjust the impedance of one or both of the differential paths of the isolator system 130 until the mismatch signal $\delta$ indicates mismatch is minimized.

The test circuit system 120 may be run to calibrate the isolator system 130 prior to running the transmitter 150 for the first time, and store calibration information in a register (in the test controller 170, for example). Thereafter, the test circuit system 120 may remain dormant until called upon (on demand or based on a predetermined schedule) to run and update the calibration information. Updating the calibration information may be desired to account for aging and value drift of components of the isolator system 130 over time. In between calibrations, whenever the main circuit system 110 is reinitialized or rebooted, the calibration information stored in the register may be used to adjust the impedance of the differential paths of the isolator system 130.

In practice, the first and second voltage domains oftentimes are fabricated on separate semiconductor dice. The isolator system may be provided on one of the semiconductor dice, either that of the first voltage domain or the second voltage domain, or may be split into two parts, one on each die. Alternatively, the isolator may be provided on a third semiconductor die that is separate from the dice of the first and second voltage domains. The test circuit system 120 may find application with a main circuit system of any configuration.

In a first configuration, the test circuit system 120 may be permanently coupled to the main circuit system 110. In this embodiment, the test transmitter 180 may be fabricated in a common semiconductor die as the transmitter 150 and the test receiver 190 may be fabricated in a common semiconductor die as the receiver 160. The test circuit system 120 may become operable at predetermined times during operation of the main circuit system 110, such as during startup of the device and/or at predetermined intervals. During runtime operation of the main circuit system 110, however, the test circuit system 120 may be dormant. The test controller 170 may determine calibration state of the isolator system which may remain in place unless overwritten by new calibration operations.

In a second configuration, the test circuit system 120 may be a discrete tester system that is separate from the main circuit system 110 altogether. The test circuit system 120 may be coupled to the main circuit system 110, run through a calibration operation, and then decoupled. In such a case, calibration settings for the isolator system 130 may be stored persistently within the isolator system 130, in a register for example.

Figure 2:
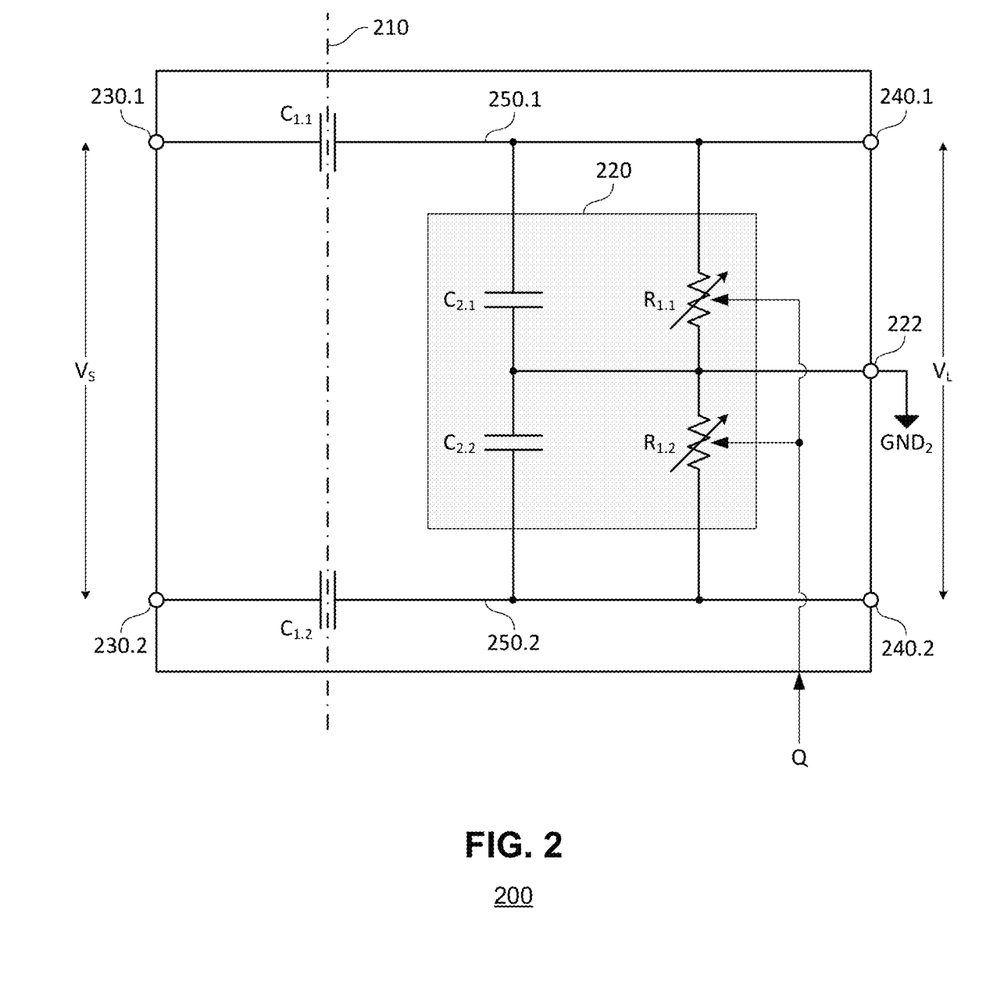
FIG. 2 illustrates a capacitive differential isolator system according to an embodiment of the present disclosure.

FIG. 2 illustrates a capacitive differential isolator system 200 according to an embodiment of the present disclosure. The isolator system 200 may be an example of the isolator system 130 of FIG. 1. The isolator system 200 may include a pair of isolators in the form of isolation capacitors $C_{1.1}$, $C_{1.2}$ that bridge an isolation barrier 210, and a filter 220 that includes a pair of filtering capacitors $C_{2.1}$, $C_{2.2}$ connected between output terminals of the isolation capacitors $C_{1.1}$, $C_{1.2}$, and a pair of resistors $R_{1.1}$, $R_{1.2}$ also connected between the output terminals of the isolation capacitors $C_{1.1}$, $C_{1.2}$. The filtering capacitors $C_{2.1}$, $C_{2.2}$ and resistors $R_{1.1}$, $R_{1.2}$ may be connected together at a center-tap terminal 222. In some embodiments, the filtering capacitors $C_{2.1}$, $C_{2.2}$ may be omitted, although parasitic capacitances present in the system may provide similar effects as the filtering capacitors $C_{2.1}$, $C_{2.2}$.

As illustrated in FIG. 2, each of the isolation capacitors $C_{1.1}$, $C_{1.2}$ may bridge the isolation barrier 210. Thus, input terminals 230.1, 230.2 of the isolation capacitors $C_{1.1}$, $C_{1.2}$ may accept a differential input signal $V_S$ in a first voltage domain, and output terminals 240.1, 240.2 of the isolation capacitors $C_{1.1}$, $C_{1.2}$ may output a differential output voltage $V_L$ to a second voltage domain that is galvanically isolated from the first voltage domain. The center-tap terminal 222 may be coupled a common mode voltage reference within the second voltage domain (shown as ground $GND_2$ in FIG. 2.

Ideally, the isolation capacitors $C_{1.1}$, $C_{1.2}$ would have identical capacitances, the filtering capacitors $C_{2.1}$, $C_{2.2}$ would have identical capacitances, and the resistors $R_{1.1}$, $R_{1.2}$ would have identical resistances such that isolator system 200 may provide differential paths 250.1, 250.2 with identical impedances. In practice, however, owing to manufacturing variations and other factors, the capacitances and resistances may not be perfectly matched, leading to an impedance mismatch between the differential paths 250.1, 250.2. As discussed, an impedance mismatch between the differential paths 250.1, 250.2 may convert common-mode interferences into unintended differential signals. These unintended differential signals may get transmitted via the isolator system 200, and undesirably and unnoticeably contribute to the differential output voltage $V_L$.

Therefore, the isolator system 200 may be implemented such that the resistances of the resistors $R_{1.1}$, $R_{1.2}$ may be varied during a calibration operation. As discussed with respect to FIG. 1, the isolator system 200 may receive a control signal Q to adjust the resistances of the resistors $R_{1.1}$, $R_{1.2}$, thereby adjusting the impedances of one or both of the differential paths 250.1, 250.2 until a mismatch between the impedances is minimized.

Figure 3:
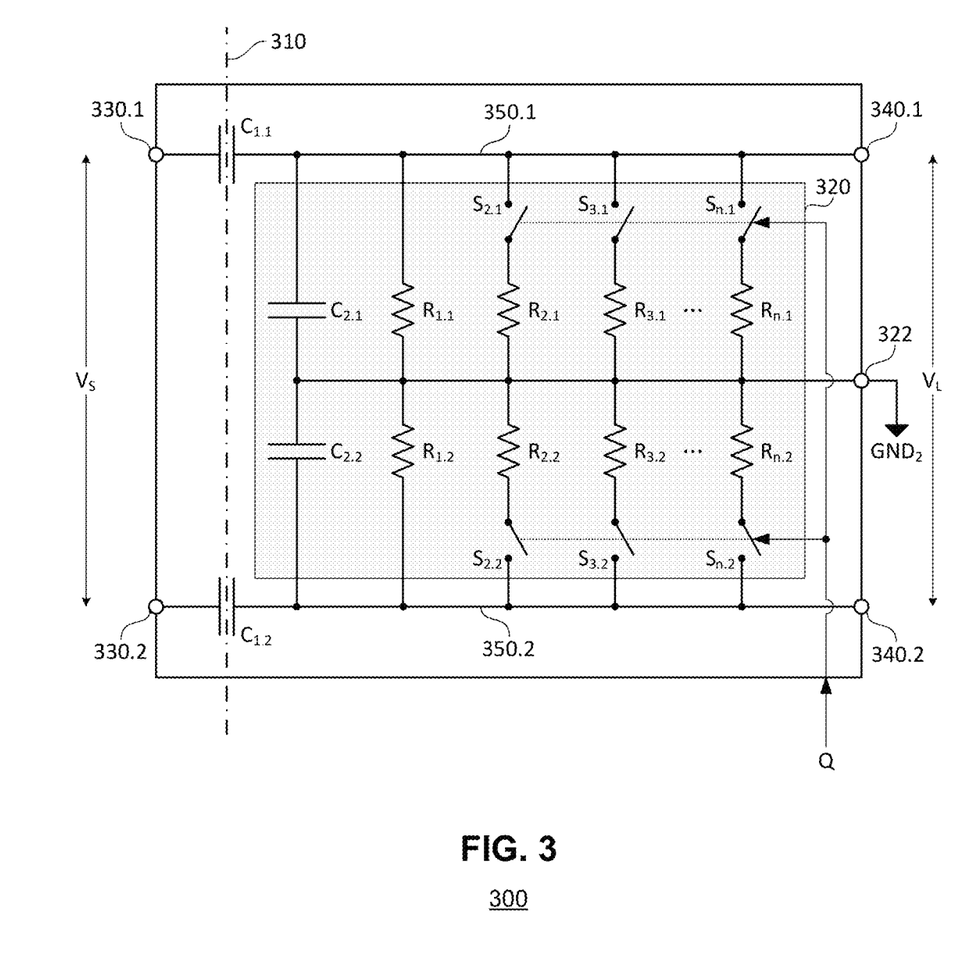
FIG. 3 illustrates a capacitive differential isolator system according to an embodiment of the present disclosure.

FIG. 3 illustrates a capacitive differential isolator system 300 according to an embodiment of the present disclosure. The isolator system 300 may be an example of the isolator system 130 of FIG. 1. More particularly, the isolator system 300 may be an example of how to implement the variable resistors $R_{1.1}$, $R_{1.2}$ of FIG. 2.

Similar to the isolator system 200 in FIG. 2, the isolator system 300 may include a pair of isolation capacitors $C_{1.1}$, $C_{1.2}$ that bridge an isolation barrier 310 and a filter 320 that may be composed of a pair of filtering capacitors $C_{2.1}$, $C_{2.2}$ connected between output terminals of the isolation capacitors $C_{1.1}$, $C_{1.2}$, and a pair of fixed resistors $R_{1.1}$, $R_{1.2}$ also connected between the output terminals of the isolation capacitors $C_{1.1}$, $C_{1.2}$. In some embodiments, the filtering capacitors $C_{2.1}$, $C_{2.2}$ may be omitted, although parasitic capacitances present in the system may provide similar effects as the filtering capacitors $C_{2.1}$, $C_{2.2}$. Additionally, the filter 320 may include a plurality of selectively-enabled circuit paths, each having a resistor ($R_{2.1} \ldots R_{n.1}$, $R_{2.2} \ldots R_{n.2}$) in series with a switch ($S_{2.1} \ldots S_{n.1}$, $S_{2.2} \ldots S_{n.2}$), and each connected across one of the resistors $R_{1.1}$, $R_{1.2}$. The selectively-enabled resistors $R_{2.1} \ldots R_{n.1}$, $R_{2.2} \ldots R_{n.2}$ may have different resistance values; for example, they may vary according to a binary-weighted distribution. The fixed resistors $R_{1.1}$, $R_{1.2}$ and the selectively-enabled resistors $R_{2.1} \ldots R_{n.1}$, $R_{2.2} \ldots R_{n.2}$ collectively may define a resistive component of the filter 320. The filtering capacitors $C_{2.1}$, $C_{2.2}$, the resistors $R_{1.1}$, $R_{1.2}$, and the plurality of circuit paths may be connected together at a center-tap terminal 322.

The isolation capacitors $C_{1.1}$, $C_{1.2}$ may accept a differential input voltage $V_S$ from a first voltage domain at their input terminals 330.1, 330.2 and output a differential output voltage $V_L$ in a second voltage domain at their output terminals 340.1, 340.2. The first voltage domain thus is galvanically isolated from the second voltage domain. The center-tap terminal 322 may be coupled a common mode voltage reference within the second voltage domain (shown as ground $GND_2$ in FIG. 2).

In the isolator system 300, an impedance mismatch between the differential paths 350.1, 350.2 may be minimized during a calibration operation by enabling one or more of the resistors $R_{2.1} \ldots R_{n.1}$, $R_{2.2} \ldots R_{n.2}$ across the resistors $R_{1.1}$, $R_{1.2}$ to effectively reduce the overall resistance. One of the resistors $R_{2.1} \ldots R_{n.1}$, $R_{2.2} \ldots R_{n.2}$ may be connected across a respective one of the resistors $R_{1.1}$, $R_{1.2}$ by having its respective switch in a closed state.

Figure 4A:
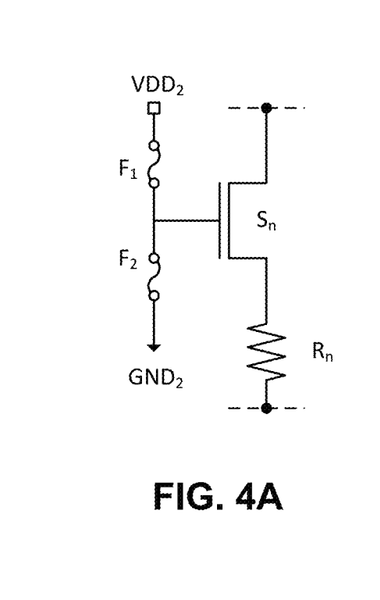
FIGS. 4A-4C illustrate switch implementations according to various embodiments of the present disclosure.
Figure 4B:
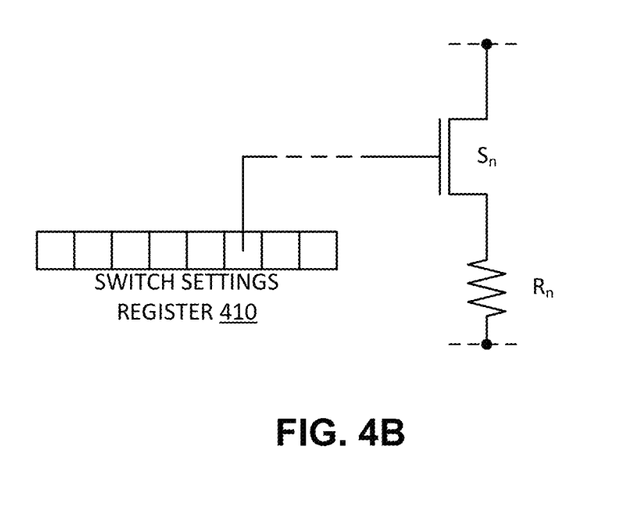
Figure 4C:
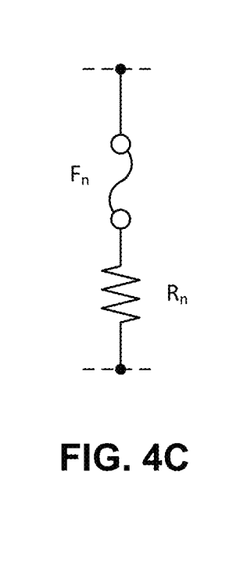

FIGS. 4A-4C illustrate implementations of the switches $S_{2.1} \ldots S_{n.1}$, $S_{2.2} \ldots S_{n.2}$ of FIG. 3, according to various embodiments of the present disclosure. Although FIGS. 4A-4C illustrate a single switch/resistor pair, the illustrate implementations may be extended to multi-resistor configurations illustrated herein.

In a first configuration shown in FIG. 4A, the switch may be implemented as a transistor $S_n$, whose gate, prior to a calibration operation, is connected to a high voltage source (e.g., $VDD_2$) or a low voltage source (e.g., to $GND_2$) via respective fusible links $F_1$, $F_2$. During calibration, if it is determined that the switch's associated resistor $R_n$ should be enabled, a fusible link $F_1$, $F_2$ may be opened in a manner to cause switch $S_n$ to be conductive. Alternatively, if it is determined that the switch's associated resistor $R_n$ should be disabled, another fusible link $F_1$, $F_2$ may be opened in a manner to cause switch Sn to be non-conductive.

FIG. 4B illustrates a second configuration, wherein the switch also may be implemented as a transistor $S_n$. In this embodiment, however, the switch $S_n$ may be controlled according to a switch setting value that is stored in a register 410. During calibration, if it is determined that the switch's associated resistor $R_n$ should be enabled, a value may be stored in the register 410 that, when output to the switch $S_n$, causes the switch $S_n$ to be conductive. Alternatively, if it is determined that the switch's associated resistor $R_n$ should be disabled, a value may be stored in the register 410 that, when output to the switch $S_n$, causes the switch $S_n$ to be non-conductive. The register 410 may have other storage locations to store values that control other switches in the filters 220, 320 (FIGS. 2, 3). The register 410 may be provided as a non-volatile storage, which permits control values for the switches to be stored persistently within the isolator system but also allows the control values to be altered from time to time. Thus, if mismatch properties of an isolator system 200, 300 vary over time due, for example, to aging of components within the isolator system, compensation effects may be performed within the system's filters 220, 320 (FIGS. 2, 3).

In a third configuration shown in FIG. 4C, the switch itself may be implemented as a fusible link $F_n$. During calibration, if it is determined that the associated resistor $R_n$ should be enabled, the fusible link $F_n$ may remain closed. Alternative, if it is determined that the switch's associated resistor $R_n$ should be disabled, the fusible link $F_n$ may be opened.

To understand how adjusting the overall resistance in an isolator system, such as the ones shown FIGS. 2 and 3, may minimize an impedance mismatch between its differential paths, it may be instructive to look at a relationship between the differential output voltage $V_L$ and the differential input voltage $V_S$. In the Laplace domain, assuming identical capacitances and identical resistances (i.e., $C_{1.1}=C_{1.2}=C_1$, $C_{2.1}=C_{2.2}=C_2$, $R_{1.1}=R_{1.2}=R_1$), the relationship may be represented as:

$$V_L(s) = \frac{s\tau_{11}}{1+s(\tau_{11}+\tau_{12})} V_S(s) = A_D(s) V_S(s) \quad (1)$$

$$\tau_{xy} = R_x C_y \quad (2)$$

The transfer function $A_D(s)$ of equation (1) may be decomposed into an upper-half transfer function $A_{DU}(s)$ related to one of two differential paths (e.g., 250.1, 350.1) and a bottom-half transfer function $A_{DB}(s)$ related to the other of the two differential paths (e.g., 250.2, 350.2) as:

$$V_L(s) = A_D(s) V_S(s) = A_{DU}(s)\left(\frac{V(s)}{2}\right) - A_{DB}(s)\left(-\frac{V(s)}{2}\right) \quad (3)$$

If the isolator system receives a common test voltage $V_T$ (as provided by the test transmitter 180 in FIG. 1 to replicate common-mode interferences) at its input terminals instead of the differential input voltage $V_S$, the transfer functions $A_{DU}(s)$ and $A_{DB}(s)$ similarly may be used to relate the differential output voltage $V_L$ to the common test voltage $V_T$ as:

$$V_L(s) = A_{DU}(s)(V_T(s)) - A_{DB}(s)(V_T(s)) = (A_{DU}(s) - A_{DB}(s)) V_T(s) \quad (4)$$

When there is no impedance mismatch between the two differential paths, the transfer functions $A_{DU}(s)$ and $A_{DB}(s)$ are identical to the transfer function $A_D(s)$ of equation (1), and may cancel each other in equation (4) (i.e., $A_{DU}(s) - A_{DB}(s) = 0$). In such a case, the common test voltage $V_T$ may not have any effect on the differential output voltage $V_L$. However, if there is an impedance mismatch, the transfer functions $A_{DU}(s)$ and $A_{DB}(s)$ may be different (i.e., $A_{DU}(s) - A_{DB}(s) \neq 0$); in which case, the common test voltage $V_T$ may translate into a differential voltage at the output terminals of the isolator system. For example, if a time constant for the transfer function $A_{DB}(s)$ is $\tau_{11}$ and that of $A_{DU}(s)$ is $\tau_{11} + \Delta\tau_{11}$, equation (4) may result in:

$$\frac{V_L(s)}{V_T(s)} = \frac{s}{1+s(\tau_{11}+\tau_{12})}\left(\frac{\Delta\tau_{11}}{\tau_{11}} - \frac{s\Delta\tau_{11}}{1+s(\tau_{11}+\tau_{12})}\right) \approx \frac{s\Delta\tau_{11}}{1+s(\tau_{11}+\tau_{11})} \quad (5)$$

The right-hand term of equation (5) is zero when $\Delta\tau_{11}=0$, that is, when there is no impedance mismatch between the two differential paths. Therefore, the goal is to minimize the mismatch $\Delta t_{11}$ between the time constants of the two differential paths in order to minimize the contribution of common-mode interferences to the differential output voltage $V_L$. Based on equation (2), the mismatch $\Delta\tau_{11}$ may be caused by one or both of a mismatch between the pair of resistors $R_{1.1}$, $R_{1.2}$ and a mismatch between the pair of isolation capacitors $C_{1.1}$, $C_{1.2}$. While the isolator systems in FIGS. 2 and 3 address adjusting the effective resistances of the resistors $R_{1.1}$, $R_{1.2}$ to minimize an impedance mismatch between the differential paths, one skilled in the art would appreciate, however, that the impedance mismatch may be also be minimized by adjusting the effective capacitances of the isolation capacitors $C_{1.1}$, $C_{1.2}$.

Figure 5:
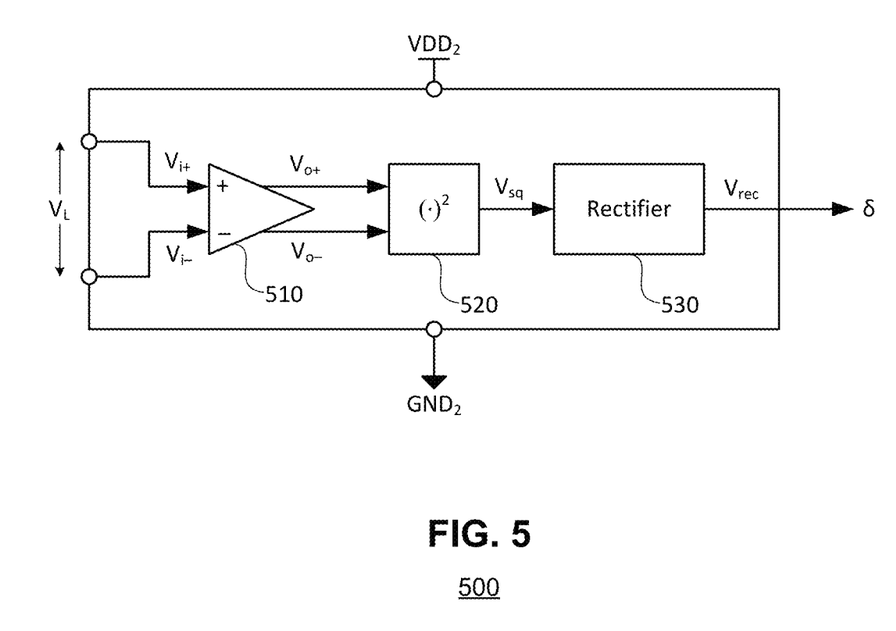
FIG. 5 illustrates a block diagram of a test receiver according to an embodiment of the present disclosure.

FIG. 5 is a block diagram of a test receiver 500 according to an embodiment of the present disclosure. The test receiver 500 may be an example of the test receiver 190 of FIG. 1, and may generate and output a mismatch signal δ based a differential output voltage $V_L$ received at its input terminals. The test receiver 500 may include an amplifier 510 to amplify the differential output voltage $V_L$, a squarer 520 to square the amplified voltage, and a rectifier 530 to condition the squared voltage into the mismatch signal δ.

The differential output voltage $V_L$ may be fed as a differential input voltage pair $V_{i+}/V_{i-}$ into the amplifier 510. The amplifier 510 may amplify the input signal pair $V_{i+}/V_{i-}$ and provide a differential output signal pair $V_{o+}/V_{o-}$ to the squarer 520. In implementation, the amplifier 510 may be provided as one or more amplifiers coupled in series to amplify the differential output voltage $V_L$.

Figure 7:
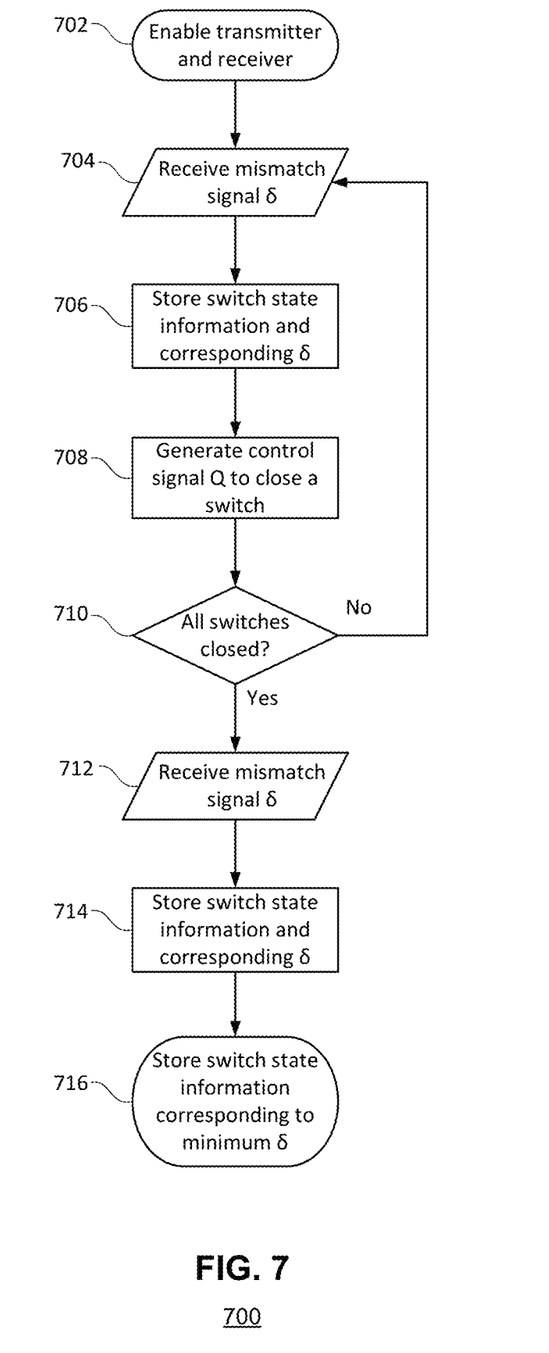
FIG. 7 is a flowchart depicting a method for calibrating a capacitive differential isolator system according to an embodiment of the present disclosure.

The squarer 520 may generate a voltage $V_{sq}$ that is proportional to the square of the differential output voltage pair $V_o+N_o-$; i.e., $V_{sq} \propto (V_{o+}-V_{o-})^2$. The rectifier 530 may then generate a voltage $V_{rec}$, which may represent an envelope of the voltage $V_{sq}$. The magnitude of the voltage $V_{rec}$ may increase as the differential output voltage $V_L$ increases. In other words, as an impedance mismatch between differential paths of an isolator system (e.g., 200, 300) increases, the magnitude of the voltage $V_{rec}$ may increase. Therefore, an impedance mismatch between the differential paths may be minimized by minimizing the magnitude of the voltage $V_{rec}$. The test receiver 500 may output the voltage $V_{rec}$ as the mismatch signal δ. An algorithm that may be employed to minimize the mismatch signal δ is depicted in FIG. 7 and discussed below.

Figure 6:
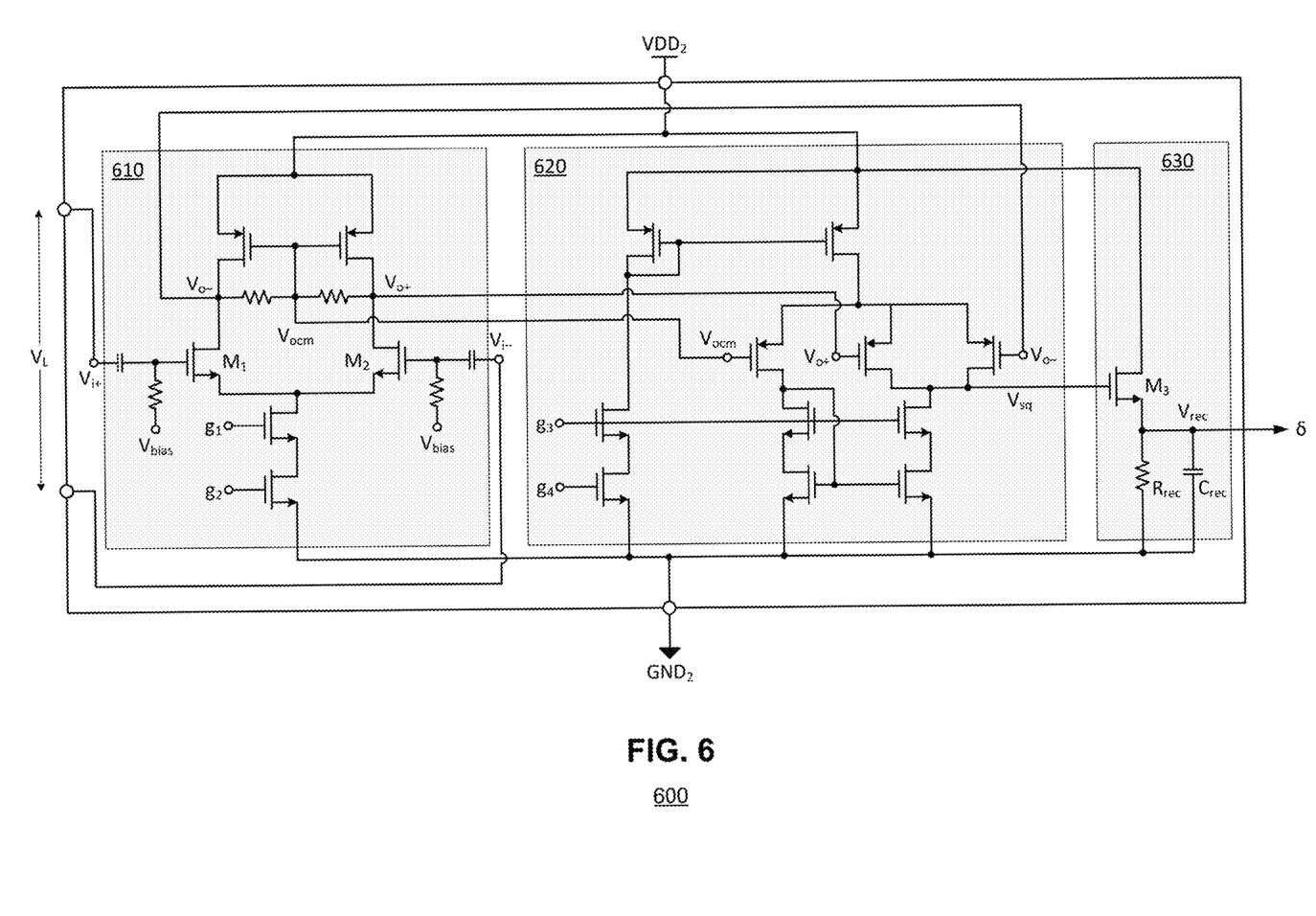
FIG. 6 illustrates a circuit diagram of a test receiver according to an embodiment of the present disclosure.

FIG. 6 is a circuit diagram of a test receiver 600 according to an embodiment of the present disclosure. The test receiver 600 may include an amplifier 610 to amplify a differential output voltage $V_L$, a squarer 620 to square the amplified voltage, and a rectifier 630 to condition the squared voltage into a mismatch signal δ. The test receiver 600 thus may generate and output the mismatch signal δ based on the differential output voltage $V_L$ received at its input terminals.

The amplifier 610 may be a common-source transistor-based ($M_1/M_2$) differential amplifier. A differential output voltage $V_L$ applied to the input terminals of the test receiver 600 may be fed as a differential input voltage pair $V_{i+}/V_{i-}$ to inputs of the amplifier 610. The amplifier 610 may amplify the differential input voltage pair $V_{i+}/V_{i-}$ and provide a differential output voltage pair $V_{o+}/V_{o-}$ to the squarer 620.

The amplifier 610 may be enabled by gate signals $g_1$ and $g_2$. The transistors $M_1/M_2$ may be biased at a voltage $V_{bias}$. As discussed, the circuitry for the amplifier 610 may be replicated and cascaded as needed to adequately amplify the differential output voltage $V_L$.

The squarer 620 may receive the differential output voltage pair $V_{o+}/V_{o-}$ from the amplifier 610 and generate a voltage $V_{sq}$ that is proportional to $(V_{o+}-V_{o-})^2$. The squarer 620 may be enabled by gate signals $g_3$ and $g_4$.

The rectifier 630 may include a transistor $M_3$ to receive at its gate the voltage $V_{sq}$ from the squarer 620, and a resistor $R_{rec}$ and a capacitor $C_{rec}$ connected in parallel and coupled to the source of the transistor $M_3$. The transistor $M_3$ may operate to provide at its source a voltage $V_{rec}$ representing an envelope of the voltage $V_{sq}$. The transistor $M_3$ may turn on when the voltage $V_{sq}$ exceeds a sum of its threshold voltage and the voltage $V_{rec}$. The parallel combination of the resistor $R_{rec}$ and the capacitor $C_{rec}$ may operate as a low-pass filter to slow down decay of peaks of the voltage $V_{rec}$, thereby smoothing out the envelope of the voltage $V_{sq}$. The magnitude of the voltage $V_{rec}$ may increase as the differential output voltage $V_L$ increases. In other words, as an impedance mismatch between differential paths of an isolator system (e.g., 200, 300) increases, the magnitude of the voltage $V_{rec}$ may increase. Therefore, an impedance mismatch between the differential paths may be minimized by minimizing the magnitude of the voltage $V_{rec}$. The test receiver 500 may output the voltage $V_{rec}$ as the mismatch signal δ. An algorithm that may be employed to minimize the mismatch signal δ is depicted in FIG. 7 and discussed below.

FIG. 7 is a flowchart depicting a method 700 for calibrating a capacitive differential isolator system (e.g., isolator systems 130 and 300) according to an embodiment of the present disclosure. The method 700 starts at step 702, where it enables a transmitter and a receiver (e.g., the test transmitter 180 and the test receiver 190 of FIG. 1) such that the transmitter drives a common signal across the isolator system. At step 704, the method 700 receives a mismatch signal δ from the receiver. At step 706, the method stores switch state information of the isolator system corresponding to the received mismatch signal δ. Initially, such switch state information may correspond to all switches being in an open state (e.g., in FIG. 3, switches $S_{2.1}\ldots S_{n.1}$, $S_{2.2}\ldots S_{n.2}$ are opened). Then, the method 700 generates a control signal Q to close one of the opened switches at step 708. At step 710, the method 700 determines whether all the switches are closed. If all the switches are not closed, the method 700 repeats steps 704-708 until all the switches are closed, and then proceeds to step 712. At step 712, the method 700 receives the mismatch signal δ and, at step 714, stores switch state information (i.e., all switches closed) corresponding to the received mismatch signal δ. The method 700 ends at step 716, where it chooses the switch state information that corresponds to a minimum mismatch signal δ and stores it into a register (e.g., a register included in the test controller 170). During runtime, each of the switches of the isolator system may be closed or left opened based on the switch state information stored in the register.

The method 700 may be carried out by the test controller 170 of FIG. 1, for example, to generate and output a control signal Q to minimize a mismatch signal δ received from the test receiver 190 (or 500, 600).

The discussion of the method 700 made reference to the differentially isolated system 100 of FIG. 1 and the isolator system 300 of FIG. 3, but it should be understood that the method 700 is not limited to the specific embodiments in FIGS. 1 and 3. The method 700 may also find application in other architectures that employ other components, such as transformers, for isolation. For example, parasitic capacitances across input and output terminals of an isolation transformer and resistances at inputs of a receiver driven by the isolation transformer may create differential paths with time constants that are not perfectly matched. As a result, similar to the systems 100, 200, and 300, common-mode transients may be translated into a differential voltage at the receiver. Therefore, the method 700 may be applied as discussed above to calibrate the mismatch.

Several embodiments of the disclosure are specifically illustrated and/or described herein. However, it will be appreciated that modifications and variations of the disclosure are covered by the above teachings and within the purview of the appended claims without departing from the spirit and intended scope of the disclosure. Further variations are permissible that are consistent with the principles described above.

What is claimed is:

1. A method of calibrating a differential isolator system having differential signal paths between first and second input terminals and first and second output terminals, the method comprising:
    driving a common signal to the first and second input terminals of the differential isolator system;
    measuring differences between signals at the first and second output terminals of the differential isolator system; and
    varying an impedance of an impedance element connected between the first output terminal and a center-tap terminal of the differential isolator system until an impedance mismatch between the differential signal paths is minimized.

2. The method of claim 1, wherein the varying comprises selectively enabling and/or disabling circuit paths that extend in parallel from respective output terminals of the first and second output terminals and the center-tap terminal, the circuit paths containing respective impedance elements.

3. The method of claim 2, further comprising storing, in a register associated with the differential isolator system, data representing which of the circuit paths is enabled and disabled for a minimum value of the impedance mismatch.

4. The method of claim 2, wherein each circuit path includes its own impedance and a switch.

5. The method of claim 1, wherein the driving and the measuring occur in different potential domains isolated by the differential isolator system.

6. The method of claim 1, further comprising generating an impedance mismatch signal by amplifying, squaring, and rectifying an output signal at the first and second output terminals.

7. The method of claim 1, wherein the differential isolator system includes a pair of capacitors that cross an isolation barrier.

8. The method of claim 1, wherein the differential isolator system includes a transformer that crosses an isolation barrier.

9. A calibration system, comprising:
    a transmitter;
    a receiver;
    a differential isolator coupling the transmitter and receiver; and
    means for calibrating the differential isolator.

10. The calibration system of claim 9, wherein the differential isolator is a capacitive differential isolator.

11. The calibration system of claim 9, wherein the means for calibrating the differential isolator comprises means for varying an impedance of an impedance network arranged between output terminals of the differential isolator.

12. The calibration system of claim 9, wherein the means for calibrating the differential isolator comprises means for selectively enabling and disabling circuit paths that extend in parallel between respective output terminals of the differential isolator and a center-tap terminal of the differential isolator.

13. A calibration system, comprising:
    a signal source configured to drive a common signal to a pair of input terminals of an isolator;
    a mismatch detector configured to generate a mismatch signal based on an output signal at a pair of output terminals of the isolator; and
    a controller configured to vary an impedance of an impedance network connected between the pair of output terminals of the isolator until the mismatch signal is minimized.

14. The calibration system of claim 13, wherein the impedance network comprises:
    a pair of impedance elements, each connected to a respective output terminal of the pair of output terminals and to each other; and
    a pair of variable resistors, each connected to a respective output terminal of the pair of output terminals and to each other at a node where the pair of impedance elements are connected together, the variable resistors having mismatched resistances.

15. The calibration system of claim 13, wherein the isolator includes a pair of capacitors that cross an isolation barrier.

16. The calibration system of claim 13, wherein the isolator includes a transformer that crosses an isolation barrier.

17. The calibration system of claim 14, wherein the pair of impedance elements comprises a pair of capacitors, each connected to a respective output terminal of the pair of output terminals and to each other.

18. The calibration system of claim 17, wherein each variable resistor of the pair of variable resistors comprises a respective plurality of selectively-enabled circuit paths each having its own impedance and control switch.

19. The calibration system of claim 18, further comprising a register storing state information of the control switches following a calibration operation.

20. The calibration system of claim 18, wherein the control switches are transistors.

21. The calibration system of claim 18, wherein the control switches are fusible links.

22. The calibration system of claim 17, further comprising a transmitter to transmit a common test signal to a pair of input terminals of the isolator.

* * * * *